United States Patent [19]

Brokaw

[11] 4,349,811

[45] Sep. 14, 1982

[54] DIGITAL-TO-ANALOG CONVERTER WITH IMPROVED COMPENSATION ARRANGEMENT FOR OFFSET VOLTAGE VARIATIONS

[75] Inventor: Adrian P. Brokaw, Burlington, Mass.

[73] Assignee: Analog Devices, Incorporated, Norwood, Mass.

[21] Appl. No.: 173,450

[22] Filed: Jul. 30, 1980

[51] Int. Cl.³ ............................................. H03K 13/02
[52] U.S. Cl. .................... 340/347 DA; 340/347 CC; 340/347 M
[58] Field of Search ..... 340/347 M, 347 CC, 347 DA

[56] References Cited

U.S. PATENT DOCUMENTS 3,940,760  2/1976  Brokaw ..................... 340/347 DA
4,176,344  11/1979  Saari et al. ................. 340/347 DA Primary Examiner—Thomas J. Sloyan
Attorney, Agent, or Firm—Parmelee, Bollinger & Bramblett

[57] ABSTRACT

A digital-to-analog converter comprising a plurality of identical transistor current sources with their emitters connected to respective shunt legs of an R–2R ladder network for establishing binary weighting of the transistor currents. The effects of variations in transistor offset voltage are compensated for by returning the ladder termination resistor to a voltage which is $2(kT/q)\ln 2$ more positive than the last active stage of the converter.

9 Claims, 6 Drawing Figures

DIGITAL-TO-ANALOG CONVERTER WITH IMPROVED COMPENSATION ARRANGEMENT FOR OFFSET VOLTAGE VARIATIONS

BACKGROUND OF THE INVENTION

1. Field of the Invention

This invention relates to digital-to-analog converters of the type having a number of transistor current sources connected to an R–2R ladder network to develop binary-weighted currents. More particularly, this invention relates to such converters provided with means to minimize errors resulting from offset voltages in the transistor current sources.

2. Description of the Prior Art

One commonly used digital-to-analog converter, described in U.S. Pat. No. Re. 28,633 (Pastoriza), comprises separate transistor current sources connected in a common base configuration with the emitters coupled to a resistance network to develop binary-weighted bit currents through the transistors. The areas of the transistor emitters are proportioned to the corresponding bit currents to provide for equal current densities in the transistors, thereby producing equal emitter voltages which track with changes in temperature. By use of a reference transistor feedback arrangement, the bit currents all can be stabilized against changes in temperature, thereby substantially avoiding temperature errors in the output analog current.

Although the scaled-emitter area arrangement described above is effective in avoiding errors due to offset voltages, it does require relatively large amounts of IC chip area, particularly when used in high-resolution single-chip converters. To avoid that result, a different solution to the problem is presented in U.S. Pat. No. 3,940,760 (Brokaw). There, the current sources are matched transistors, i.e. having equal emitter areas, so that the $V_{BE}$ offset voltages do not track with temperature. The transistor bases are interconnected by respective resistors, and a current proportional to absolute temperature (PTAT) is caused to flow through all of those interbase resistors in series. This current produces temperature-responsive interbase compensating voltages which match the $\Delta V_{BE}$ voltages between successive current source transistors. Thus the emitters of all of the current source transistors are maintained at equal potential, so that there is no temperature-induced change in the bit currents through the current-setting resistance network resulting from offset voltage changes.

The interbase resistor arrangement described above is effective in minimizing errors due to differences in current-source $V_{BE}$, and has gone into extensive commercial use. However, that arrangement does require the addition of a set of well-matched resistors and associated circuitry. Thus, it has been desired to provide offset voltage compensation in a more efficient manner.

SUMMARY OF THE INVENTION

In a preferred embodiment of the present invention, to be described hereinbelow in detail, a digital-to-analog converter is provided comprising a number of separate transistor current sources connected in a common base configuration to an R–2R ladder network. The termination resistor (2R) of the ladder network is connected to a voltage source developing a termination voltage which is $2(kT/q) \ln 2$ more positive than the emitter of the last stage of the converter. This voltage produces through the series resistors of the ladder a compensating current which develops corresponding voltage components matching the $\Delta V_{BE}$ voltages between successive stages, so that the voltage across each of the shunt resistors of the ladder remains unaffected by changes in offset voltage. Thus the bit currents can be maintained constant notwithstanding temperature-induced changes in $V_{BE}$.

Accordingly, it is a principal object of this invention to provide an improved digital-to-analog converter. Another object of the invention is to provide superior means for minimizing errors due to changes in offset voltage of the transistor current sources of a digital-to-analog converter. Other objects, aspects and advantages of the invention will in part be pointed out in, and in part apparent from, the following description of a preferred embodiment of the invention, considered together with the accompanying drawings.

DESCRIPTION OF A PREFERRED EMBODIMENT

Figure 1:
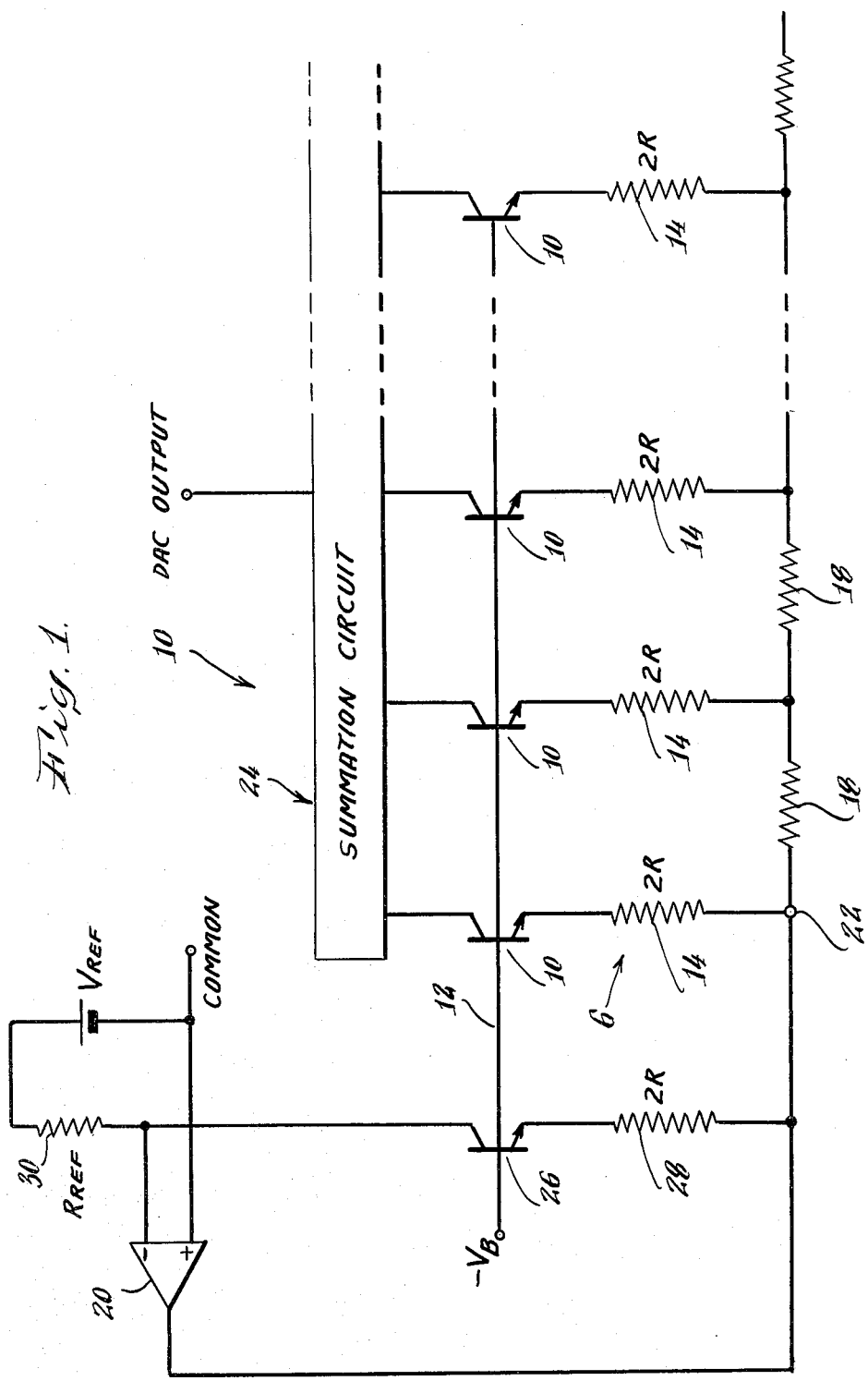
FIG. 1 is a circuit diagram illustrating a portion of a conventional digital-to-analog converter incorporating an R–2R ladder network.

FIG. 1 shows in outline form a portion of a circuit based on a known type of digital-to-analog converter. Such converter comprises a number of identical transistors 10 connected as current sources, with their bases tied to a common line 12 and their emitters connected to respective shunt resistors 14 of an R–2R ladder 16 having series resistors 18. The base line 12 is held fixed at a voltage designated $-V_B$, and the output of an operational amplifier 20 applies an excitation voltage to the input terminal 22 of the ladder 16. The collector currents of the transistors 10 are selectively summed at 24 to produce the desired analog output signal corresponding to an applied digital signal, for example by means of circuitry as shown in U.S. Pat. No. 3,961,326 (Craven).

The ladder excitation voltage is controlled by a feedback loop comprising a reference transistor 26 with its emitter connected through a 2R resistor 28 to the output of the operational amplifier 20. The base of this transistor is tied to the common base line 12, and the collector is connected to one input terminal of the amplifier. Also connected to this input terminal is a source of constant reference current comprising a reference resistor 30 and a stable source of reference voltage $V_{REF}$. The amplifier 20 continuously compares the collector current with this reference current, and sets the voltage at the lower end of resistor 28 so as to maintain the collector current equal to the reference current. Since the voltage at the lower end of resistor 28 also is applied to the ladder input terminal 22, the control of that voltage by the amplifier 20 serves also to stabilize the collector currents of the current source transistors 10.

One problem presented by such a converter is that the source transistors 10 have different offset voltages ($V_{BE}$), due to the fact that the transistors operate at different current densities. Moreover, the difference between these offset voltages ($\Delta V_{BE}$) is temperature sensitive, so that it is not possible simply to make a compensating adjustment in the resistor network values to accommodate the difference from stage to stage.

However, it has been found that the problem can be solved by connecting the usual ladder termination resistor to a voltage which is more positive than the emitter of the last source transistor by an amount equal to twice $\Delta V_{BE}$, i.e. $2(kT/q) \ln 2$. This will produce binarily-weighted currents in the R–2R ladder network, unaffected by changes in $V_{BE}$ in the source transistors.

Figure 2:
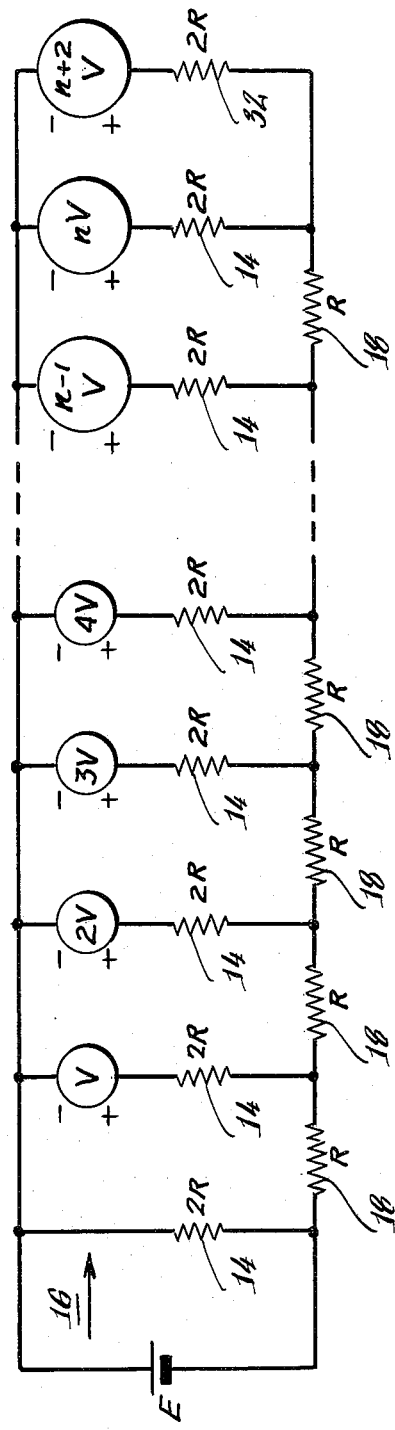
FIG. 2 is a diagrammatic representation of a ladder network to aid in explaining the principles of the invention.

To show that this is so, reference is first made to FIG. 2 which presents a simplified schematic to air in explaining certain aspects of the present invention. If it is assumed that the shunt leg voltages labelled "V" are zero, the shunt resistors 14 of the ladder network 16 all will be terminated at the same voltage, just as in the prior art compensation arrangements discussed above. In that event, an excitation voltage E applied at the left-hand end of the ladder will set up a current in the left-most 2R shunt resistor, and the subsequent portions of the ladder will divide the current in a 2:1 ratio at each stage so that the current in the second 2R leg is half that in the first leg, and so forth.

If, however, the shunt resistors 14 are terminated in uncompensated emitters of matched common base transistors (as in FIG. 1), the voltage on each leg will be disturbed. Assuming that E is generated with respect to the first emitter voltage, the emitter terminating the second leg will be at a voltage which is about $(kT/q) \ln 2$ more positive than the first emitter, since the second transistor will operate at about half the current density of the first, the emitter terminating the third leg similarly is about $(kT/q) \ln 2$ more positive than the second leg, and so on from stage to stage down the ladder. [Note: The difference in voltage between successive stages would not be precisely $(kT/q) \ln 2$ because the presence of the offset voltage of an uncompensated emitter will slightly alter the current division from the ideal 2:1 ratio.]

Now let it be supposed that the first shunt leg in FIG. 2 is disturbed by a voltage V (as shown), and that the second leg is disturbed by a voltage which is exactly 2 V, and so on. Also, let it be supposed that the ladder termination resistor 32 (having a value of 2R) is returned to a voltage which is 2 V greater than that of the last active leg having an offset nV. The currents in the legs now will, again, be in exact binary weighting. If this is the case, the matched transistors 10 will produce offsets differing by exactly $(kT/q) \ln 2$ per stage.

Figure 3:
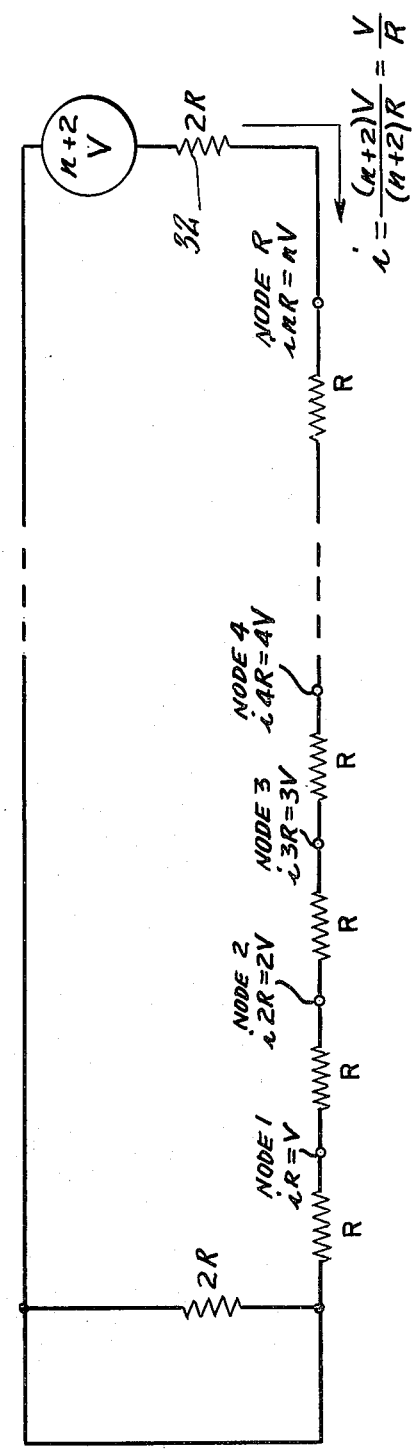
FIG. 3 is an abbreviated showing of a ladder network to aid in explaining the principles of the invention.

To demonstrate that the currents in the shunt legs will under the supposed circumstances be in exact binary weighting, reference is made to FIG. 3 showing an abbreviated circuit of the ladder and terminating arrangement of FIG. 2. For simplicity the excitation E has been set to zero. With the 2R shunt legs of the ladder removed (except for the terminating resistor 32 at the right), the total resistance across the terminating voltage $(n+2)V$ will be the sum of the n series resistors 18 of value R and the 2R terminator 32, or $(n+2)R$. The resulting current will be just $V/R$. As this current flows through the string of series resistors 18 of value R, it will generate a voltage V across each one.

The voltage at node 1 will be V so that if the first 2R leg and its offset V were replaced in the circuit, no current would flow in that leg. Similarly, the second 2R leg could be replaced and its 2 V offset would be matched by the 2 V voltage at node 2, so that no current would flow in that leg either. Continuing in this way, all the legs and their respective offset generators could be replaced and no current would flow in the legs. Since, under these conditions, the currents in the legs would represent the error currents produced by the introduction of the offsets, it will be apparent that the errors are zero.

Now, by application of the principle of superposition, a non-zero excitation voltage E can be re-established without interfering with the error correction provided. Since the error voltages were presumed to be constant, the excitation will develop exact binary-weighted currents in the legs of the ladder. Such currents will produce at the emitters of the transistors 10 offset voltages differing by exact multiples of $(kT/q) \ln 2$, satisfying the original assumptions.

Figure 4:
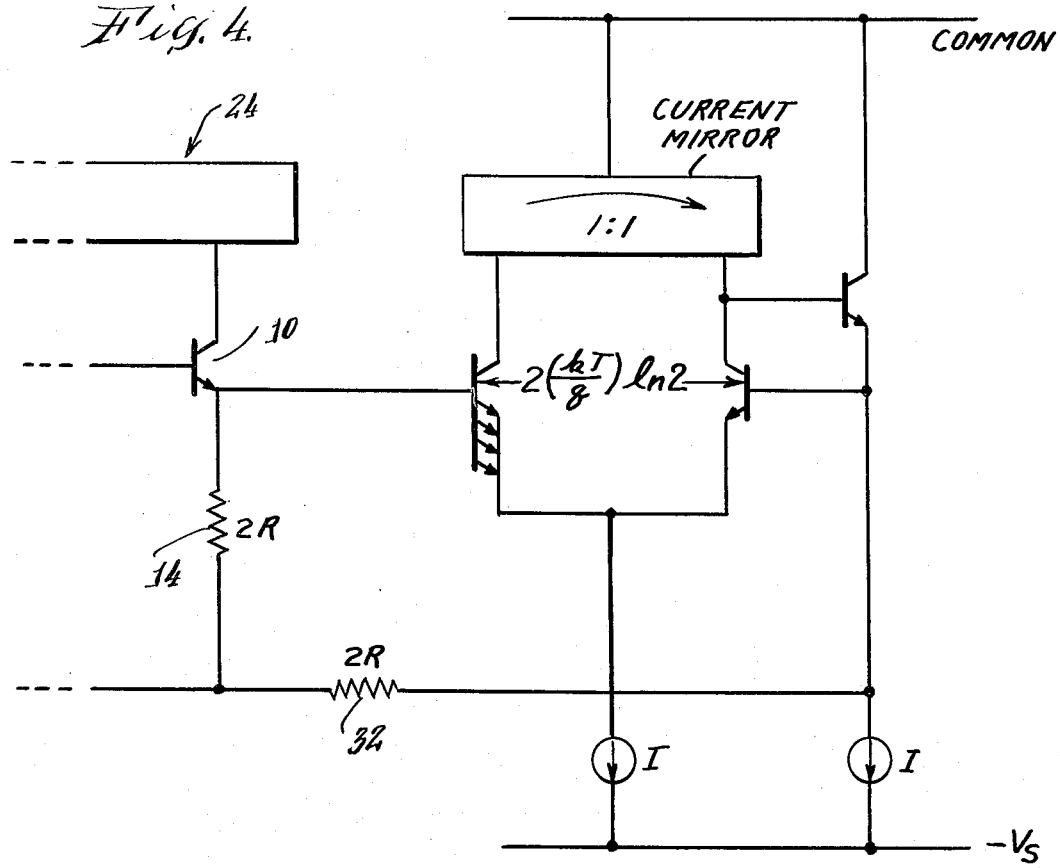
FIG. 4 shows one illustrative ladder termination arrangement in accordance with the invention.

FIG. 4 shows a schematic of one simple circuit for developing a voltage of $2(kT/q) \ln 2$ for the 2R termination resistor 32. This circuit comprises a follower with a built-in offset of $(kT/q) \ln 4 = 2(kT/q) \ln 2$.

Figure 5:
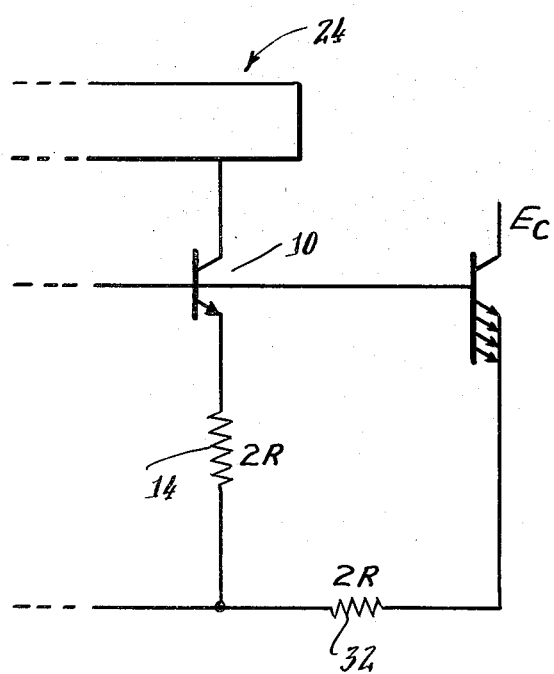
FIG. 5 shows another ladder termination arrangement.

An even simpler arrangement can be used on converters with less demanding performance specifications. If the voltage across the termination resistor 32 is large compared to $2(kT/q) \ln 2$, the the current in it will differ only a little from the current in the last active stage. In that case, as shown in FIG. 5, an additional transistor with an emitter area between 4 and 5 times that of the last stage, and with its base tied to all the other bases, could be used to provide a reasonable correction with only a small error.

Figure 6:
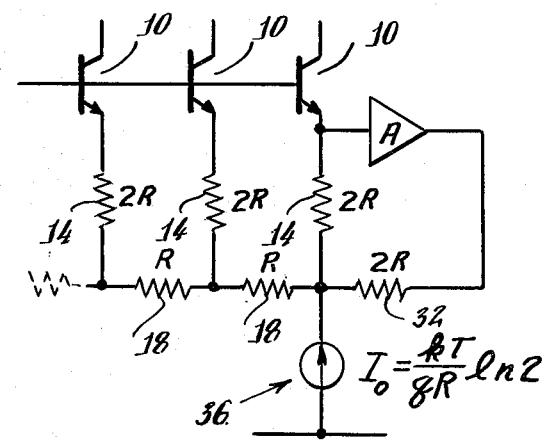
FIG. 6 shows a further ladder termination arrangement.

As shown in FIG. 6, the invention also can be implemented through use of a current source, illustrated at 36, which in this case is arranged to direct into the end of the ladder network a current $I_o = (kT/qR) \ln 2$. This will develop the appropriate compensating current through the series resistors R of the ladder network.

Although preferred embodiments of the invention have been set forth in detail, it is to be understood that this is for the purpose of illustrating the invention, and should not be construed as necessarily limiting the scope of the invention, since it is apparent that many changes can be made to the disclosed embodiments by those skilled in the art to suit particular applications.

I claim:

1. In a digital-to-analog converter of the type including a plurality of transistors serving as current sources and having equal emitter areas, means connecting the bases of said transistors together, an R–2R ladder network with the shunt resistors thereof connected to respective current-source emitters to provide for binary weighting of the transistor currents, and a source of excitation voltage connected to said ladder network to develop said binary-weighted currents through said transistors;

that improvement for minimizing errors due to offset voltages in the transistors, comprising:

compensating means connected to said ladder network to develop a flow of compensating current through the series resistors thereof;

said compensating current having a magnitude to produce across each of said series resistors a compensating voltage component at least substantially equal to the difference between the offset voltages of successive transistor current sources.

2. A converter as in claim 1, wherein said ladder network includes at one end thereof a termination resistor having a value of 2R;

said compensating means comprising a voltage source connected to the end of said termination resistor to apply thereto a voltage which is $2(kT/q) \ln 2$ more than the voltage on the emitter of the adjacent current source transistor.

3. A converter as in claim 1, wherein said compensating means comprises a current source producing a temperature-responsive output current directed to one end of said ladder network.

4. A converter as in claim 1, wherein said compensating voltage component has a magnitude of at least substantially $2(kT/q) \ln 2$.

5. A converter as in claim 1, wherein said compensating means comprises a temperature-responsive voltage generator;

a termination resistor at one end of said ladder network; and means connecting said voltage generator to said termination resistor to develop said compensating current therethrough and into said series resistors.

6. A converter as in claim 1, wherein said compensating means comprises a follower producing an offset voltage of $2(kT/q) \ln 2$;

said follower being connected between the emitter of the last converter stage and a termination resistor having a value of 2R to develop the compensating current through said series resistors.

7. A converter as in claim 1, wherein said compensating means comprises an additional transistor with its base connected to the base line of said current source transistors and its emitter connected through a resistor to one end of said ladder to produce a flow of current through said series resistors;

said additional transistor having an emitter area substantially greater than the emitter area of said source transistors.

8. A converter as in claim 7, wherein said additional transistor emitter area is at least 4× as great as the emitter area of said source transistors, and said resistor connected to said additional transistor has a value of 2R to provide proper termination for the ladder network.

9. A converter as in claim 2, wherein said source of excitation voltage is connected to the other end of said ladder network.

* * * * *